(12) United States Patent
Nakajima

(10) Patent No.: US 7,768,076 B2
(45) Date of Patent: Aug. 3, 2010

(54) SEMICONDUCTOR DEVICE COMPRISING AN N-CHANNEL AND P-CHANNEL MISFET

(75) Inventor: Kazuaki Nakajima, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/113,290

(22) Filed: May 1, 2008

(65) Prior Publication Data

US 2008/0277736 A1 Nov. 13, 2008

(30) Foreign Application Priority Data

May 8, 2007 (JP) .............................. 2007-123362

(51) Int. Cl.
*H01L 29/78* (2006.01)
(52) U.S. Cl. ........................ 257/407; 257/388; 257/412; 257/E21.632; 257/E27.062; 438/199; 438/275
(58) Field of Classification Search ........................ None
See application file for complete search history.

(56) References Cited

U.S. PATENT DOCUMENTS

| | | | |
|---|---|---|---|
| 6,833,596 B2 * | 12/2004 | Matsuo ........................ | 257/412 |
| 7,071,656 B2 | 7/2006 | Taniguchi | |
| 7,145,208 B2 * | 12/2006 | Yang et al. ................... | 257/407 |
| 7,598,545 B2 * | 10/2009 | Cartier et al. ................ | 257/251 |
| 2005/0164441 A1 * | 7/2005 | Ohnishi et al. ............... | 438/201 |
| 2006/0003507 A1 * | 1/2006 | Jung et al. .................... | 438/197 |
| 2006/0131676 A1 * | 6/2006 | Saito et al. .................... | 257/412 |

(Continued)

FOREIGN PATENT DOCUMENTS

JP 2003-282875 10/2003

(Continued)

OTHER PUBLICATIONS

Notification of Reasons for Rejection issued by the Japanese Patent Office on Aug. 14, 2009, for Japanese Patent Application No. 2007-123362, and English-language translation thereof.

*Primary Examiner*—Thanh V Pham
*Assistant Examiner*—Andres Munoz
(74) *Attorney, Agent, or Firm*—Finnegan, Henderson, Farabow, Garrett & Dunner, L.L.P.

(57) ABSTRACT

A semiconductor device has an n-channel MISFET having first diffusion layers formed in a first region of a surface portion of a semiconductor substrate so as to sandwich a first channel region therebetween, a first gate insulating film formed on the first channel region, and a first gate electrode including a first metal layer formed on the first gate insulating film, and a first n-type polysilicon film formed on the first metal layer, and a p-channel MISFET having second diffusion layers containing boron as a dopant and formed in a second region of the surface portion of the semiconductor substrate so as to sandwich a second channel region therebetween, a second gate insulating film formed on the second channel region, and a second gate electrode including a second metal layer containing nitrogen or carbon and formed on the second gate insulating film and a second n-type polysilicon film formed on the second metal layer and having a boron concentration of not more than $5\times10^{19}$ $cm^{-3}$ in a portion adjacent an interface with the second metal layer.

5 Claims, 10 Drawing Sheets

U.S. PATENT DOCUMENTS

| | | | |
|---|---|---|---|
| 2007/0090427 A1* | 4/2007 | Nakajima | 257/295 |
| 2007/0187797 A1* | 8/2007 | Kato et al. | 257/500 |
| 2007/0257308 A1* | 11/2007 | Lee et al. | 257/334 |
| 2009/0152636 A1* | 6/2009 | Chudzik et al. | 257/369 |

FOREIGN PATENT DOCUMENTS

| | | |
|---|---|---|
| JP | 2006-156807 | 6/2006 |
| JP | 2008-537359 | 9/2008 |
| WO | WO 2006/115894 | 11/2006 |

* cited by examiner

SEMICONDUCTOR DEVICE COMPRISING AN N-CHANNEL AND P-CHANNEL MISFET

CROSS REFERENCE TO RELATED APPLICATIONS

This application is based upon and claims the benefit of priority from the prior Japanese Patent Application No. 2007-123362, filed on May 8, 2007, the entire contents of which are incorporated herein by reference.

BACKGROUND OF THE INVENTION

Field of the Invention

The present invention relates to a semiconductor device and a method of manufacturing the semiconductor device.

A polysilicon film doped with an impurity by ion implantation is used as a gate electrode of a transistor. The polysilicon film can be used to form a gate electrode having a work function suitable for an electrical polarity of the transistor. For example, in a CMOS transistor, an n-type doped polysilicon film and a p-type doped polysilicon film can be used in an NMOS transistor and a PMOS transistor, respectively.

However, such a gate electrode using a polysilicon film suffers from depletion, increasing the effective thickness of a gate insulating film. The gate depletion becomes a serious problem with downscaling.

In attempt to solve such a problem, a proposal has been made of a metal gate electrode including a metal film which is free from depletion. One metal gate electrode structure is a polysilicon/metal stacked electrode structure using a metal layer in a lower portion of the gate electrode and polysilicon in an upper portion of the gate electrode. This structure is advantageous in that the structure has compatibility with a conventional salicide process while relieving the burden on the gate processing by thinning the metal layer.

A proposal has been made of a semiconductor device wherein: the above-described structure is applied to a CMOS transistor; and polysilicon used in the gate electrode of a PMOS transistor and that used in the gate electrode of an NMOS transistor are doped to have the same conductivity type, thereby further simplifying the gate processing.

However, in cases where polysilicon is doped with, for example, boron by implantation to have p-type conductivity, B-N bond formation occurs at an interface with a metal nitride used as a reaction preventive layer for preventing reaction at a polysilicon/metal interface, to cause an electrically active boron concentration at the interface to lower considerably. This results in a problem that an interface resistance rises to cause the operation speed of the MOS transistor to lower.

Alternatively, in cases where polysilicon is doped with, for example, phosphorus by implantation to have n-type conductivity, boron used to form a diffusion layer of the PMOS transistor intrudes into polysilicon and some boron concentrations in the polysilicon allow the B—N bond formation to occur at an interface with a metal nitride used as a reaction preventive layer in the same manner as described above. This might result in a danger of raising the interface resistance to cause the operation speed of the MOS transistor to lower.

SUMMARY OF THE INVENTION

According to one aspect of the present invention, there is provided a semiconductor device comprising:

an n-channel MISFET having first diffusion layers formed in a first region of a surface portion of a semiconductor substrate so as to sandwich a first channel region therebetween, a first gate insulating film formed on the first channel region, and a first gate electrode including a first metal layer formed on the first gate insulating film, and a first n-type polysilicon film formed on the first metal layer; and a p-channel MISFET having second diffusion layers containing boron as a dopant and formed in a second region of the surface portion of the semiconductor substrate so as to sandwich a second channel region therebetween, a second gate insulating film formed on the second channel region, and a second gate electrode including a second metal layer containing nitrogen or carbon and formed on the second gate insulating film and a second n-type polysilicon film formed on the second metal layer and having a boron concentration of not more than $5 \times 10^{19}$ cm$^{-3}$ in a portion adjacent an interface with the second metal layer.

According to one aspect of the present invention, there is provided a method of manufacturing a semiconductor device, comprising:

forming a first insulating film on a first region and a second region of a semiconductor substrate;

forming a first metal film on the first insulating film;

removing the first metal film in the first region;

forming a second metal film on the first region of the semiconductor substrate and the second region of the first metal film;

forming a third metal film on the second metal film;

forming an n-type polysilicon film on the third metal film;

forming a second insulating film on the n-type polysilicon film;

removing the second insulating film, the n-type polysilicon film, the third metal film, the second metal film, and the first insulating film in a predetermined region of the first region, and the second insulating film, the n-type polysilicon film, the third metal film, the second metal film, the first metal film, and the first insulating film in a predetermined region of the second region, thereby forming gate electrodes;

implanting an n-type impurity into the first region of the semiconductor substrate, with the gate electrode serving as a mask, thereby forming first diffusion layers; and implanting boron into the second region of the semiconductor substrate, with the gate electrode serving as a mask, thereby forming second diffusion layers.

According to one aspect of the present invention, there is provided a method of manufacturing a semiconductor device, comprising:

forming a first insulating film on a first region and a second region of a semiconductor substrate;

forming a first metal film on the first insulating film;

removing the first metal film in the first region;

forming a second metal film on the first region of the semiconductor substrate and the second region of the first metal film;

forming a third metal film on the second metal film;

forming an n-type polysilicon film on the third metal film;

forming a second insulating film on the n-type polysilicon film;

removing the second insulating film, the n-type polysilicon film, the third metal film, the second metal film, and the first insulating film in a predetermined region of the first region, and the second insulating film, the n-type polysilicon film, the third metal film, the second metal film, the first metal film, and the first insulating film in a predetermined region of the second region, thereby forming gate electrodes;

implanting an n-type impurity into the second region of the semiconductor substrate, with the gate electrode serving as a mask, thereby forming first diffusion layers; and implanting boron into the first region of the semiconductor substrate, with the gate electrode serving as a mask, thereby forming second diffusion layers.

DETAILED DESCRIPTION OF THE INVENTION

Hereinafter, a semiconductor device according to an embodiment of the present invention will be described with reference to the drawings.

Figure 1:
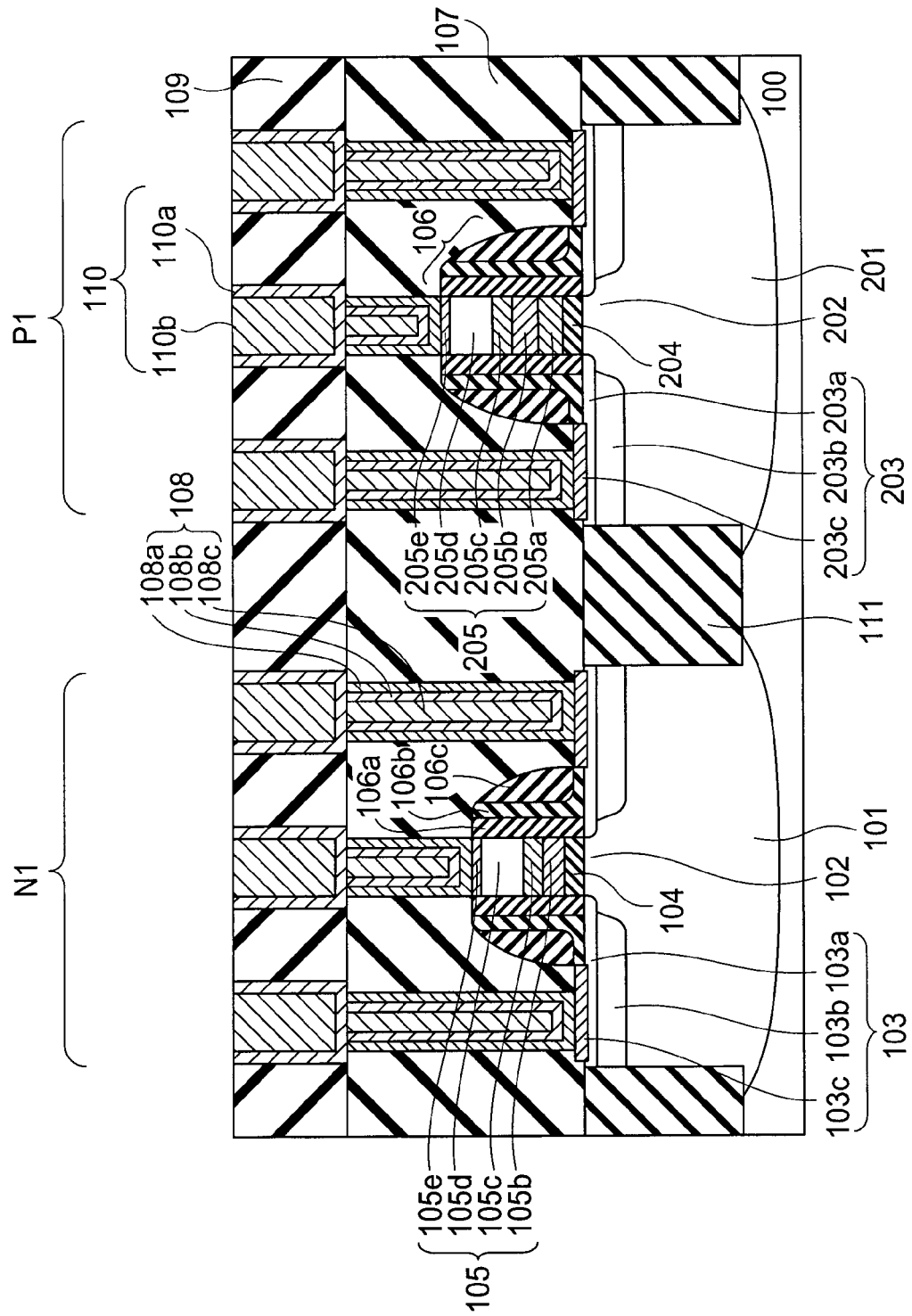
FIG. 1 is a view schematically showing a configuration of a semiconductor device according to an embodiment of the present invention.

FIG. 1 is a view schematically showing a configuration of a semiconductor device according to an embodiment of the present invention. The semiconductor device has a CMIS (Complementary Metal Insulator Semiconductor) structure having an NMIS transistor region N1 and a PMIS transistor region P1.

In the NMIS transistor region N1, a p-well 101 is formed in a silicon substrate 100. In a surface portion of the p-well 101, diffusion layers 103 which will form source/drain regions are formed so as to sandwich a channel region 102 therebetween.

The diffusion layers 103 each include a shallow diffusion layer 103a containing arsenic as a dopant, a deep diffusion layer 103b containing phosphorus as a dopant, and a nickel silicide film 103c formed on a surface of the shallow diffusion layer 103a.

A gate insulating film 104 containing hafnium is formed over the channel region 102. On the gate insulating film 104 there is formed a gate electrode 105 in which a tantalum carbide film 105b, a titanium nitride film 105c, a polysilicon film 105d and a nickel silicide film 105e are sequentially stacked.

The polysilicon film 105d is an n-type polysilicon film implanted with phosphorus. The titanium nitride film 105c is a reaction preventive film for preventing the polysilicon film 105d and the tantalum carbide film 105b from reacting with each other. The tantalum carbide film 105b controls the work function of the NMIS transistor.

In the PMIS transistor region P1, an n-well 201 is formed in the silicon substrate 100. In a surface portion of the n-well 201, diffusion layers 203 which will form source/drain regions are formed so as to sandwich a channel region 202 therebetween. The diffusion layers 203 each include a shallow diffusion layer 203a and a deep diffusion layer 203b each containing boron as a dopant, and a nickel silicide film 203c formed on a surface of the shallow diffusion layer 203a.

A gate insulating film 204 containing hafnium is formed over the channel region 202. On the gate insulating film 204 there is formed a gate electrode 205 in which a tungsten film 205a, a tantalum carbide film 205b, a titanium nitride film 205c, a polysilicon film 205d and a nickel silicide film 205e are sequentially stacked.

Like the polysilicon film 105d, the polysilicon film 205d is an n-type polysilicon film implanted with phosphorus. The titanium nitride film 205c is a reaction preventive film for preventing the polysilicon film 205d and the tantalum carbide film 205b from reacting with each other. The tungsten film 205a controls the work function of the PMIS transistor.

On the sidewall of each of the gate electrodes 105 and 205, a gate sidewall film 106 is formed which includes a silicon nitride film 106a, a silicon oxide film 106b, and a silicon nitride film 106c.

An interlayer insulator 107 is formed so as to cover the diffusion layers 103 and 203, gate electrodes 105 and 205, and gate sidewall films 106. Contacts 108 are formed, each of which extends through the interlayer insulator 107 to electrically connect to a respective one of the diffusion layers 103 and 203 and gate electrodes 105 and 205. Each contact 108 has a titanium film 108a, a titanium nitride film 108b, and a tungsten film 108c.

An interlayer insulator 109 is formed over the interlayer insulator 107. Interconnection 110 is formed which extends through the interlayer insulator 109 to electrically connect to the contacts 108. The interconnection 110 has a tantalum nitride film 110a and a copper film 110b. Each of the interlayer insulators 107 and 109 is a silicon oxide film for example.

A device isolation insulator film 111 is formed in a surface portion of the substrate 100 between the NMIS transistor region N1 and the PMIS transistor region P1. The device isolation insulator film 111, which is embedded in a trench, is a silicon oxide film for example.

In the case of typical gate electrodes of polysilicon, an n-type polysilicon electrode and a p-type polysilicon electrode are used on an nMIS side and a pMIS side, respectively, in order to control the work functions of the gate electrodes. With the gate electrodes 105 and 205 of the polysilicon film/ metal stacked structure as in the present embodiment, by contrast, the work functions of the gate electrodes 105 and 205 are controlled by the metal films 105b and 205a forming lower layers and, hence, the polysilicon film 205d in the PMIS transistor region P1 can be formed of the n-type polysilicon implanted with phosphorus.

Figure 2:
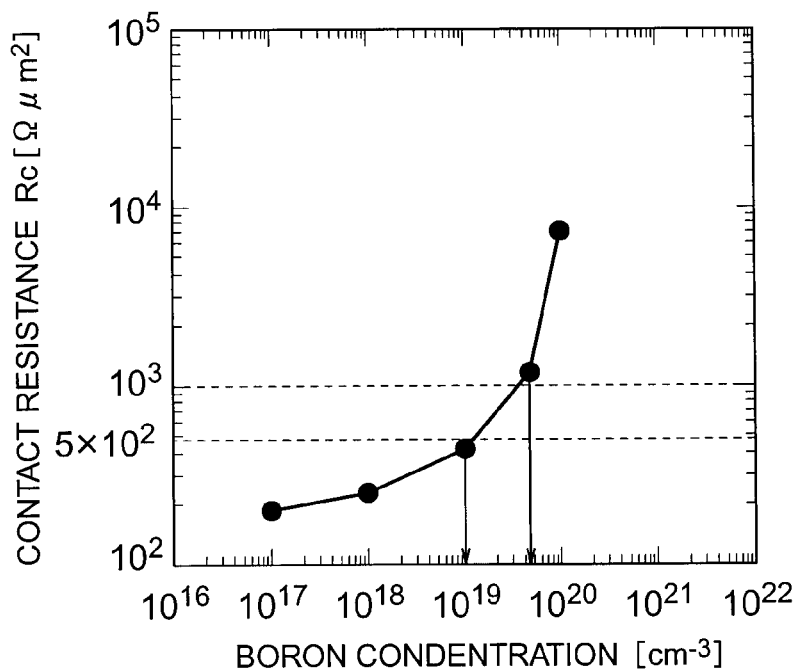
FIG. 2 is a graph showing a relationship between a boron concentration and a contact resistance.

It is possible that boron used as an impurity in the formation of the diffusion layers 203 intrudes into the polysilicon film 205d. FIG. 2 shows a relationship between a boron concentration in the polysilicon film 205d at an interface with the titanium nitride film 205c and a contact resistance Rc between the polysilicon film 205d and the titanium nitride film 205c. As can be seen from FIG. 2, the contact resistance Rc rises with increasing boron concentration. This is because boron (B) is bonded to nitrogen (N) in the titanium nitride film 205c to form a B—N reaction layer, which makes it difficult for a current to pass across the metal (titanium nitride film 205c)-semiconductor (polysilicon film 205d) interface.

Figure 3:
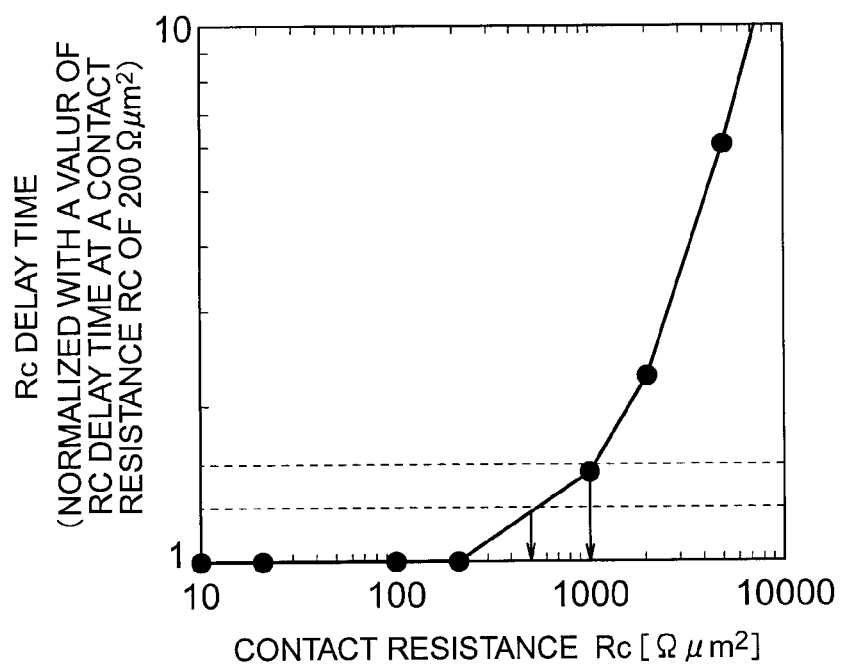
FIG. 3 is a graph showing a relationship between a contact resistance and an RC delay time.

FIG. 3 shows a relationship between the contact resistance Rc between the polysilicon film 205d and the titanium nitride film 205c and an RC delay time. The vertical axis represents a value of RC delay time that is normalized with an RC delay time at a contact resistance Rc of $200\Omega/\mu m^2$, and the horizontal axis represents the contact resistance Rc.

The RC delay time becomes longer with increasing contact resistance Rc. When the contact resistance Rc exceeds $1,000\Omega/\mu m^2$, the RC delay time increases steeply. The RC delay time at a contact resistance Rc of $1,000\Omega/\mu m^2$ is about 1.5 times as long as that at the contact resistance Rc of $200\Omega/\mu m^2$. As can be seen from FIG. 2, the boron concentration in the polysilicon film 205d is about $5\times10^{19}$ cm$^{-3}$ when the contact resistance Rc reaches $1,000\Omega/\mu m^2$. Designs for some device applications permit such a degree of increase in the RC delay time.

However, a shorter RC delay time is more preferable for relaxing design limitations. A desirable value of the RC delay time is not more than a value assumed before the RC delay time begins increasing steeply, for example, not more than a value about 1.25 times as long as the RC delay time at the contact resistance Rc of $200\Omega/\mu m^2$.

The contact resistance Rc assumes a value of about $500\Omega/\mu m^2$ when the RC delay time assumes the value about 1.25 times as long as the RC delay time at the contact resistance Rc of $200\Omega/\mu m^2$. Therefore, the boron concentration in the polysilicon film 205d at the interface with the titanium nitride film 205c is desirably not more than about $1\times10^{19}$ cm$^{-3}$, as can be seen from FIG. 2.

Description will be made of a method of fabricating such a semiconductor device with reference to FIGS. 4 to 7 each illustrating a process step.

Figure 4:
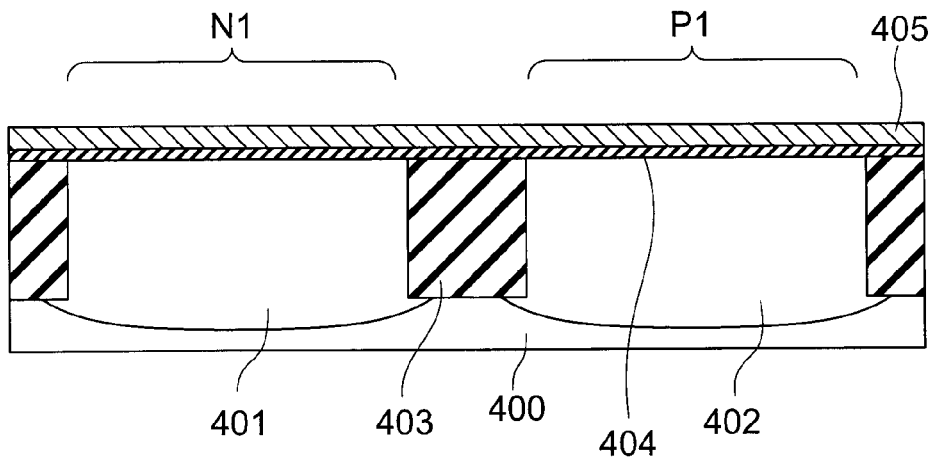
FIG. 4 is a sectional view illustrating one step of a method for manufacturing a semiconductor device according to the embodiment.

As shown in FIG. 4, on a silicon substrate 400 having a surface portion in which a p-well 401, an n-well 402 and a device isolation region 403 are formed, a gate insulating film 404 containing hafnium is formed by chemical vapor deposition (CVD) for example.

Subsequently, a tungsten film 405 having a work function of 4.9 eV is formed to a thickness of 10 nm over the gate insulating film 404 by CVD using an organic source for example. A region for forming an NMIS transistor therein and a region for forming a PMIS transistor therein are determined as a region N1 and a region P1, respectively.

Figure 5:
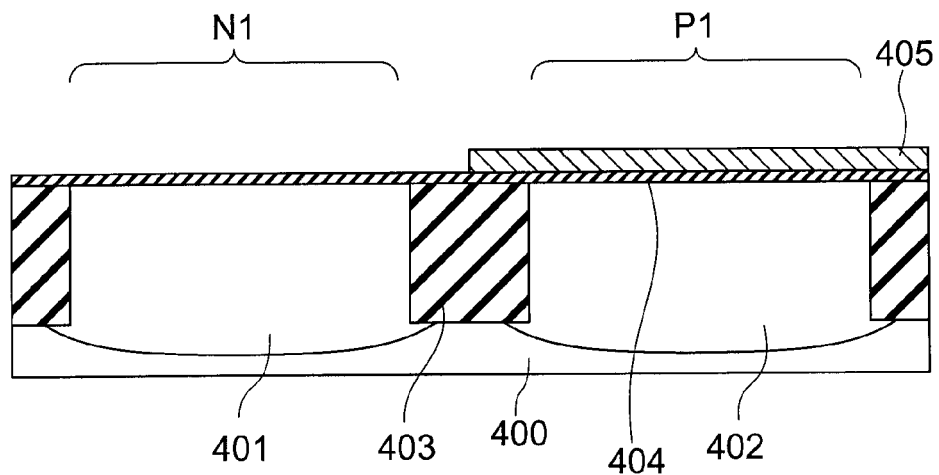
FIG. 5 is a sectional view showing a step subsequent to FIG. 4.

As shown in FIG. 5, a portion of the tungsten film 405 which lies in the region N1 is removed.

Figure 6:
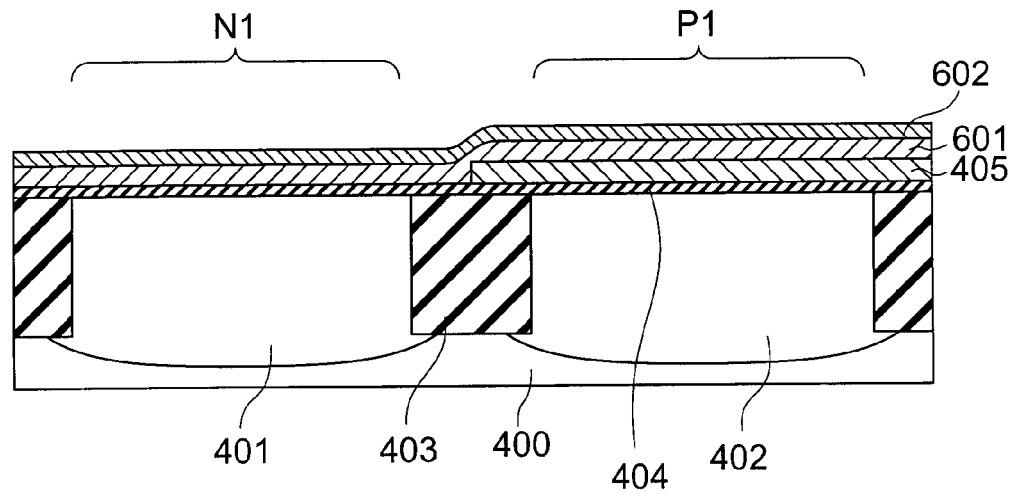
FIG. 6 is a sectional view showing a step subsequent to FIG. 5.

As shown in FIG. 6, a tantalum carbide film 601 having a work function of 4.2 eV is formed to a thickness of 10 nm over the entire surface by CVD for example. Further, a titanium nitride film 602 having a thickness of 5 nm is formed over the tantalum carbide film 601.

Figure 7:
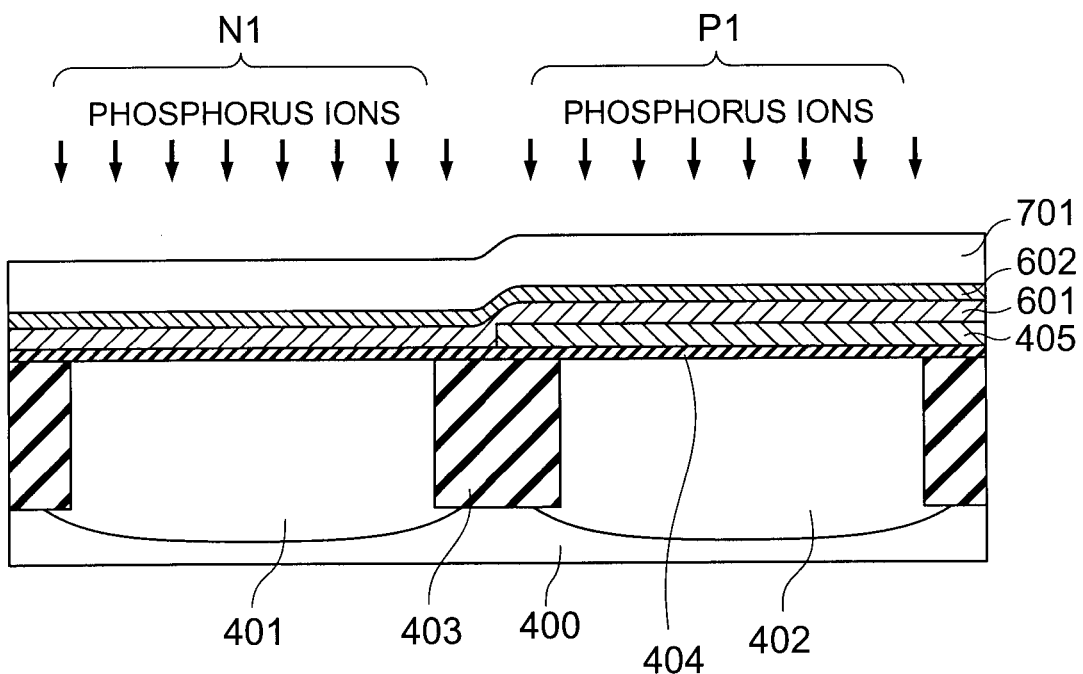
FIG. 7 is a sectional view showing a step subsequent to FIG. 6.

As shown in FIG. 7, a polysilicon film is formed over the titanium nitride film 602, and the regions N1 and P1 are both subjected to phosphorus ion implantation to form an n-type polysilicon film 701. The titanium nitride film 602 is a reaction preventive film for preventing the n-type polysilicon film 701 from reacting with the tantalum carbide film 601. Prior to the formation of the polysilicon film, a diluted HF treatment may be carried out to remove natural oxide formed on the titanium nitride film 602.

It is possible to form the n-type polysilicon film 701 by forming a polysilicon film previously containing an impurity (phosphorus). In this case, a problem with the ion implantation, such as channeling, does not occur and, therefore, the thickness of the n-type polysilicon film 701 can be reduced.

Figure 8:
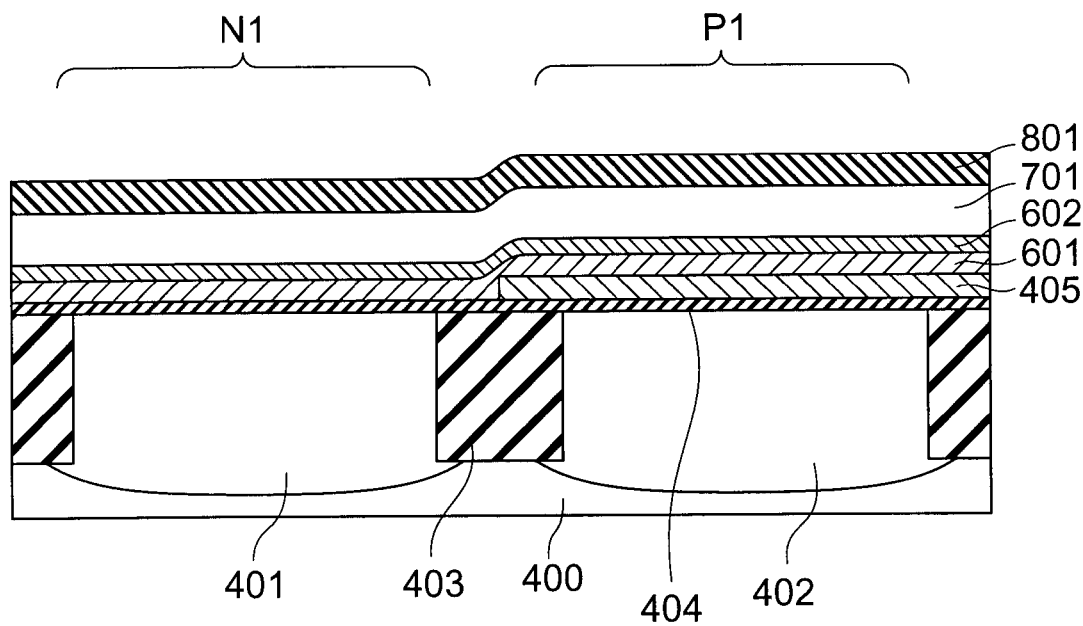
FIG. 8 is a sectional view showing a step subsequent to FIG. 7.

As shown in FIG. 8, a silicon nitride film 801 is formed over the n-type polysilicon film 701.

Figure 9:
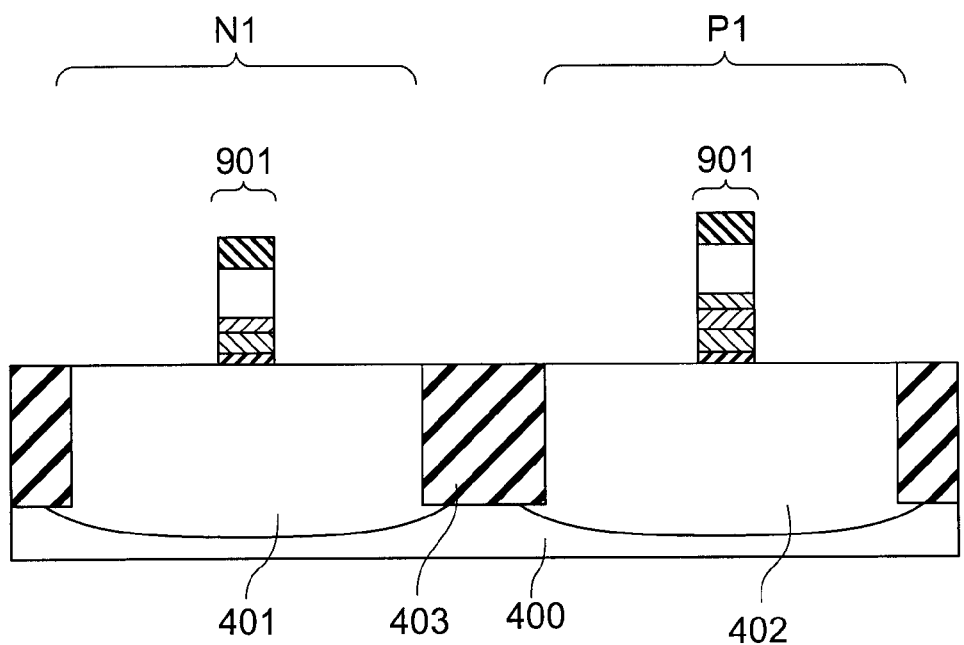
FIG. 9 is a sectional view showing a step subsequent to FIG. 8.

As shown in FIG. 9, anisotropic etching is performed to remove unnecessary portions of the silicon nitride film 801, n-type polysilicon film 701, titanium nitride film 602, tantalum carbide film 601, tungsten film 406 and gate insulating film 404 so as to obtain a 30 nm gate width pattern for example. Thus, gate electrodes 901 are formed.

Figure 10:
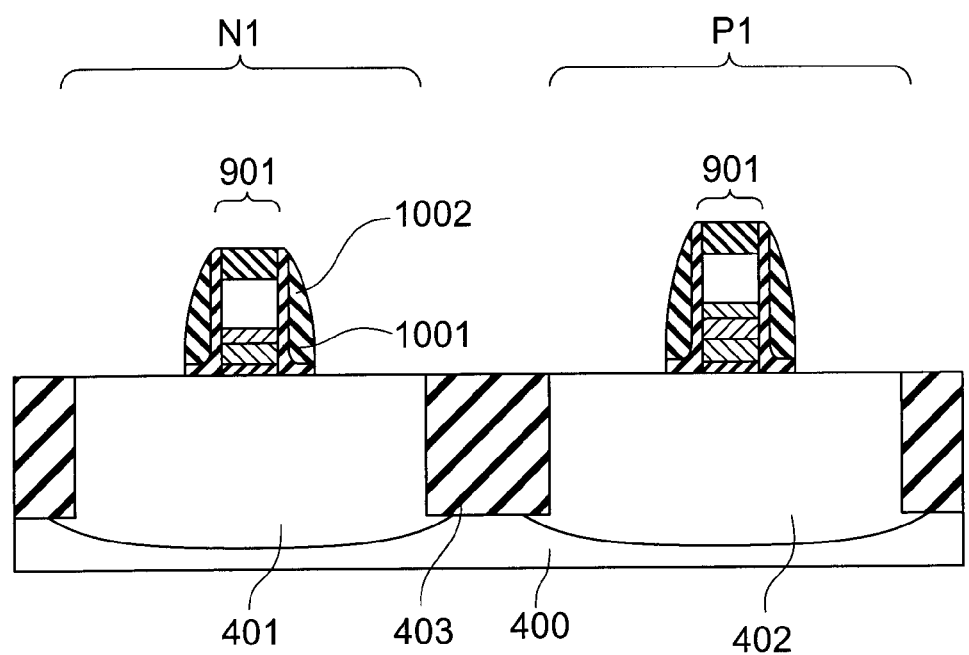
FIG. 10 is a sectional view showing a step subsequent to FIG. 9.

As shown in FIG. 10, a silicon oxide film 1001 and a silicon nitride film 1002 are deposited and then etched back to form a structure surrounding the sidewall of each gate electrode 901.

Figure 11:
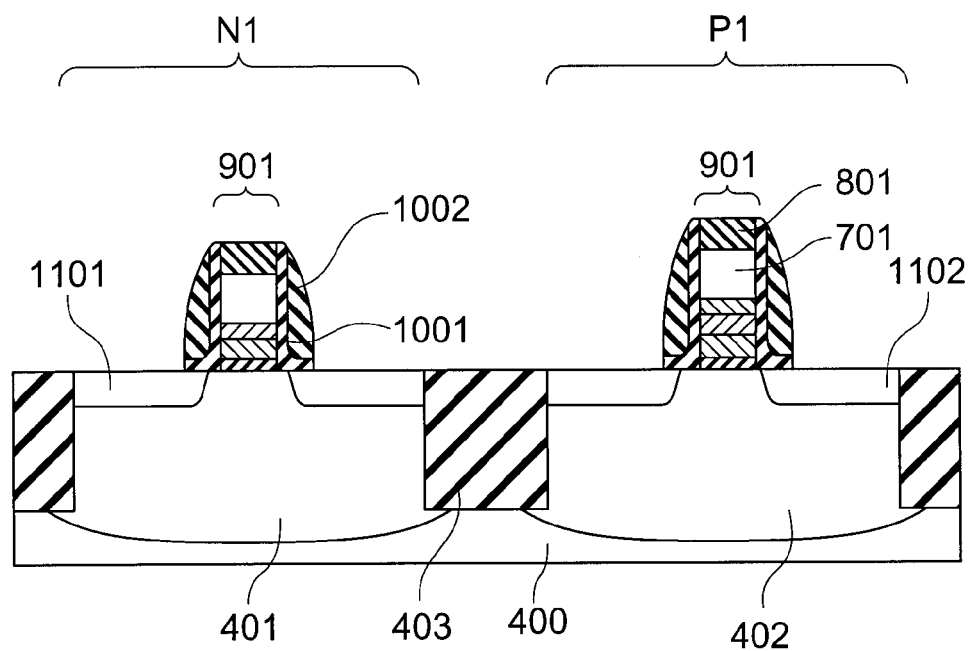
FIG. 11 is a sectional view showing a step subsequent to FIG. 10.

As shown in FIG. 11, the region N1 (p-well 401) and region P1 (n-well 402) of the silicon substrate 400 are implanted with phosphorus ions and boron ions, respectively. Subsequently, a heat treatment is carried out, for example, at 1,030° C. for five seconds, to form diffusion layers 1101 and 1102. Ion implantation in the region N1 and that in the region P1 are performed separately. The region P1 is masked during the ion implantation in the region N1, while the region N1 masked during the ion implantation in the region P1. The silicon nitride film 801 prevents the n-type polysilicon film 701 from being implanted with boron during the boron ion implantation in the region P1.

Figure 12:
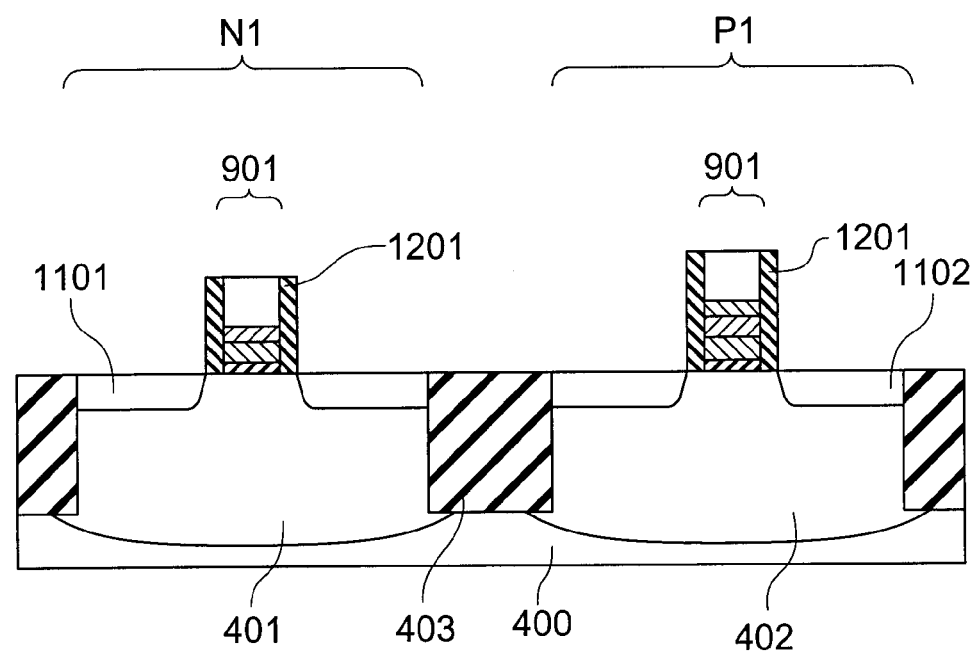
FIG. 12 is a sectional view showing a step subsequent to FIG. 11.

As shown in FIG. 12, the silicon oxide film 1001 and silicon nitride film 1002 on the sidewall portion of each electrode 901 are removed. At that time, the silicon nitride film 801 is also removed. Thereafter, a silicon nitride film 1201 is deposited and then etched back to form a structure surrounding the sidewall of each gate electrode 901.

Figure 13:
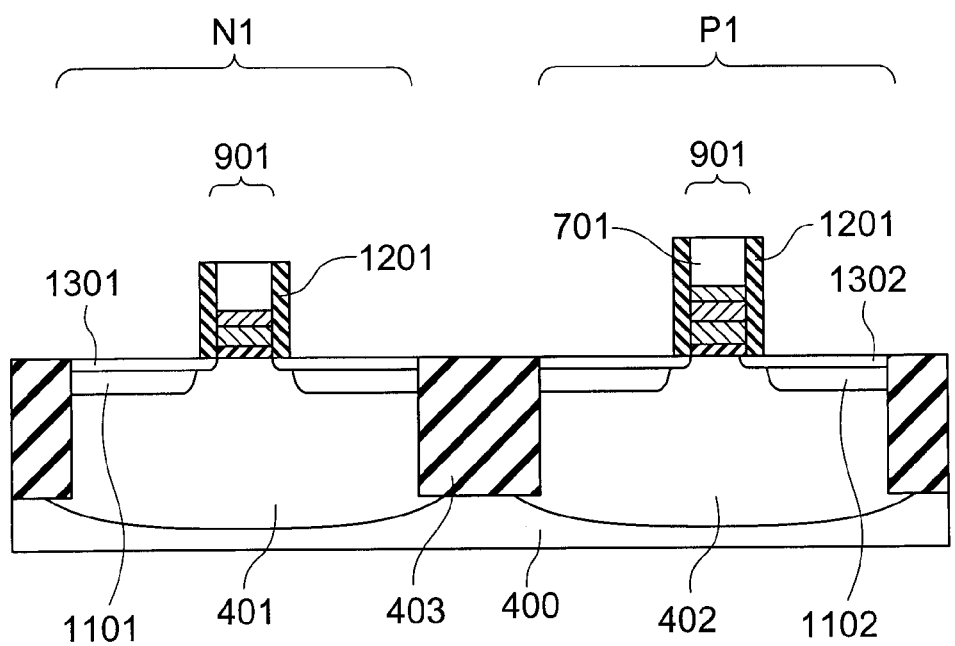
FIG. 13 is a sectional view showing a step subsequent to FIG. 12.

As shown in FIG. 13, the region N1 (p-well 401) and region P1 (n-well 402) of the silicon substrate 400 are implanted with arsenic ions and boron ions, respectively. Subsequently, a heat treatment is carried out, for example, at 800° C. for five seconds, to form diffusion layers 1301 and 1302 which are shallower than the diffusion layers 1101 and 1102.

As in the step illustrated in FIG. 11, the region P1 is masked during the ion implantation in the region N1, while the region N1 masked during the ion implantation in the region P1. The ion implantations in the step illustrated in FIG. 13 are each performed at a smaller dose and a lower acceleration voltage than in the step illustrated in FIG. 11. For this reason, the amount of boron that is allowed to intrude into the n-type polysilicon film 701 in the region P1 can be reduced to a very small value.

By previously forming the deep diffusion layers 1101 and 1102, the shallow diffusion layers 1301 and 1302 fail to undergo the heat treatment required for the formation of the deep diffusion layers 1101 and 1102. For this reason, it is possible to suppress expansion of the shallow diffusion layers 1301 and 1302.

Figure 14:
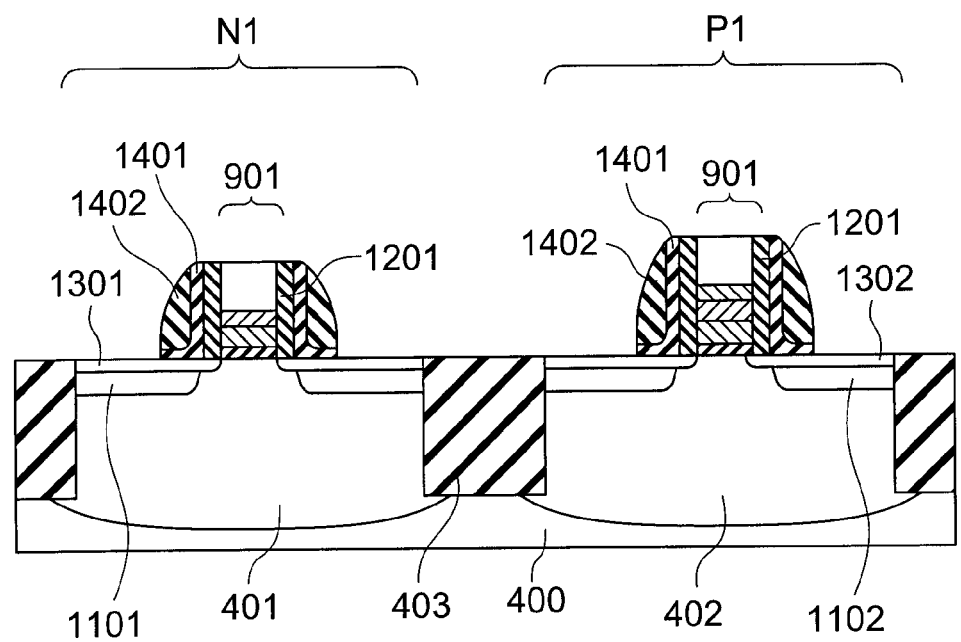
FIG. 14 is a sectional view showing a step subsequent to FIG. 13.

As shown in FIG. 14, a silicon oxide film 1401 and a silicon nitride film 1402 are formed and then etched back to form a structure surrounding the sidewall (i.e., silicon nitride film 1201) of each gate electrode 901.

Figure 15:
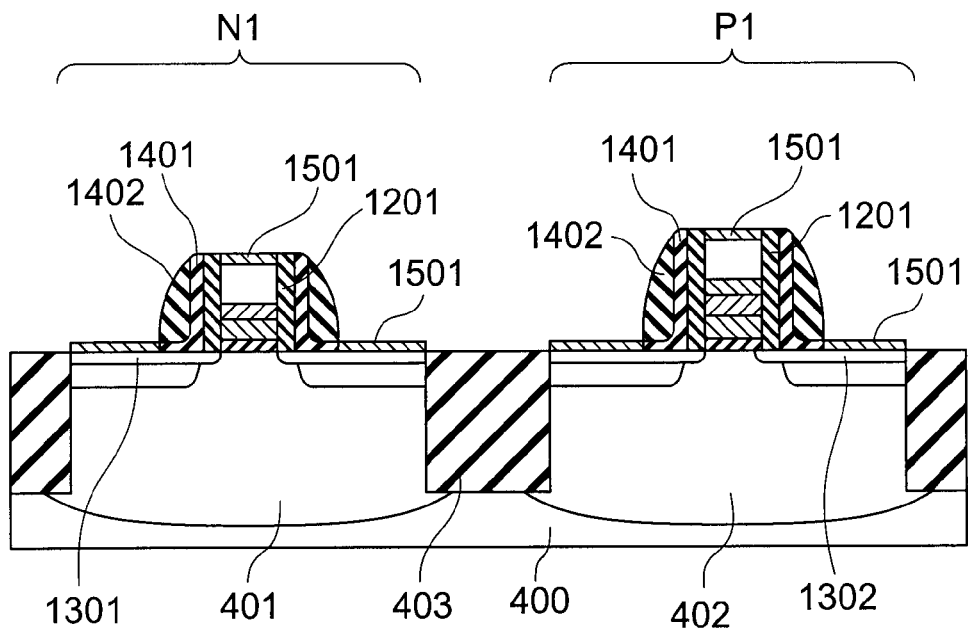
FIG. 15 is a sectional view showing a step subsequent to FIG. 14.

As shown in FIG. 15, a nickel film is deposited over the entire substrate surface and then subjected to a heat treatment at 350° C. for 30 seconds, to form nickel silicide films 1501 on the diffusion layers 1301 and 1302 and the n-type polysilicon films 701. Unreacted nickel film is removed using a mixture of sulfuric acid and hydrogen peroxide solution for example.

Figure 16:
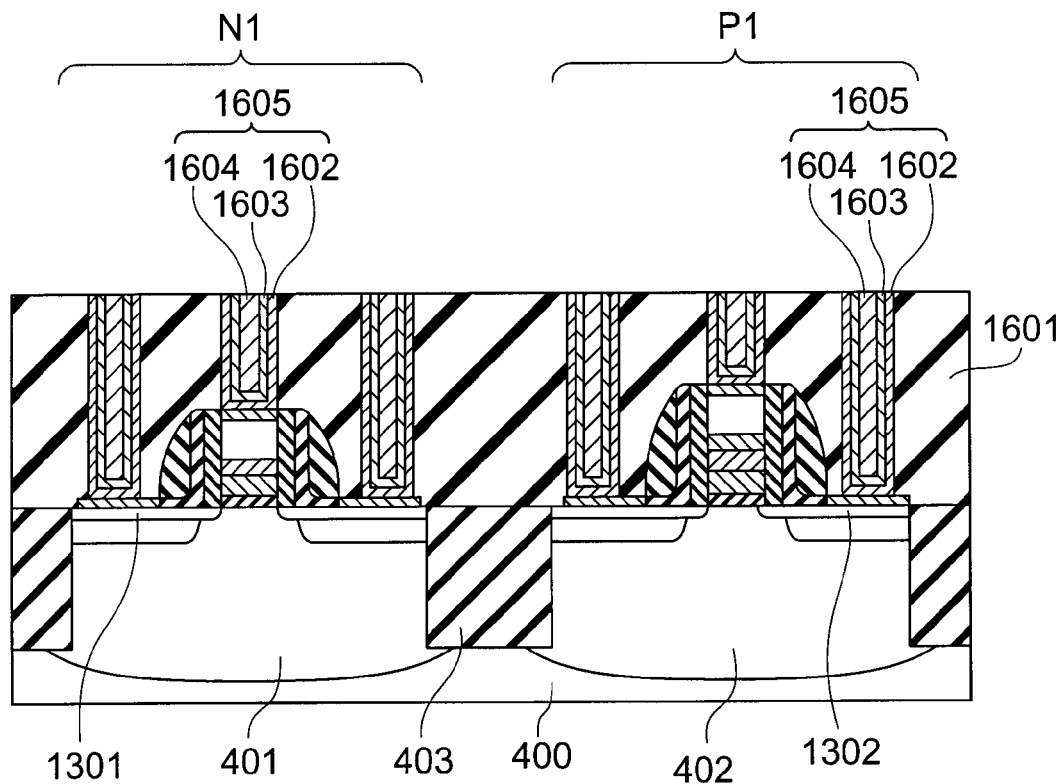
FIG. 16 is a sectional view showing a step subsequent to FIG. 15.

As shown in FIG. 16, an interlayer insulator 1601 of, for example, a silicon oxide film is deposited, and contact holes in a desired pattern are formed to extend through the interlayer insulator 1601. Thereafter, a titanium film 1602, a titanium nitride film 1603 and a tungsten film 1604 are deposited so as to fill up the contact holes and then planarized by CMP (Chemical Mechanical Polishing), to form contacts 1605.

Figure 17:
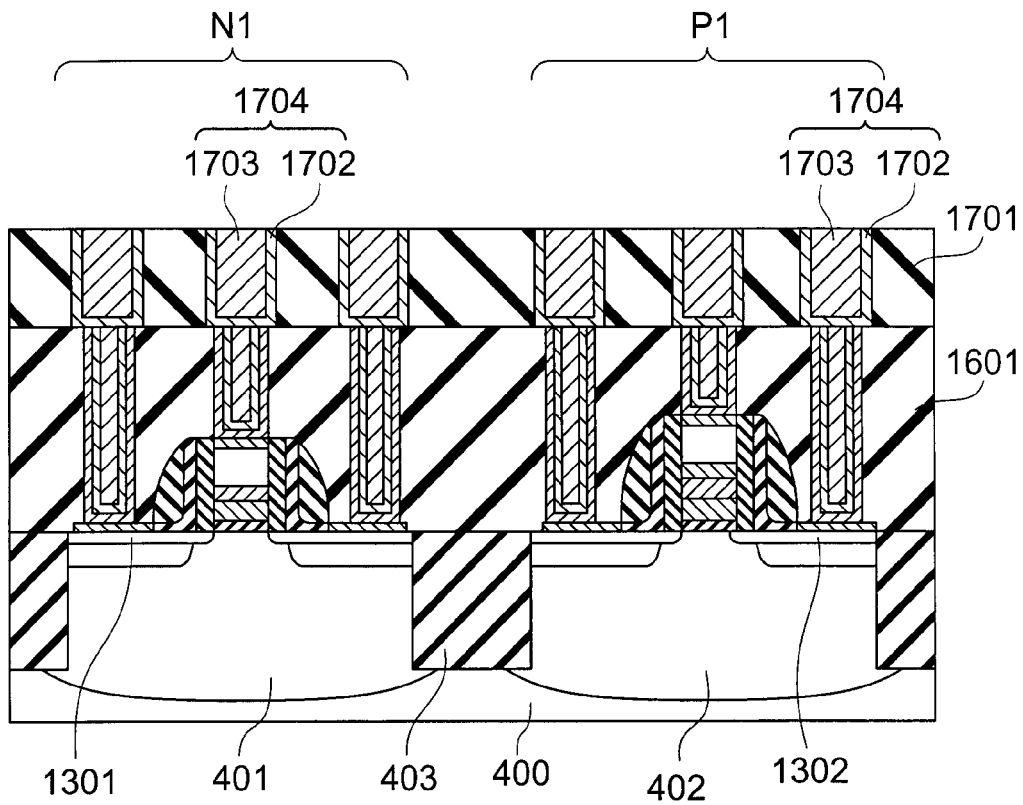
FIG. 17 is a sectional view showing a step subsequent to FIG. 16.

As shown in FIG. 17, an interlayer insulator 1701 of, for example, a silicon oxide film is deposited, and grooves are formed into a desired pattern. Thereafter, a tantalum nitride film 1702 and a copper film 1703 are deposited so as to fill up the grooves and then planarized by CMP, to form copper interconnection 1704 to be electrically connected to the contacts 1605.

In the structure described above, the work function of a metal material in contact with the gate insulating film 404 dominates the threshold value of a transistor. Since the metal material in contact with the gate insulating film 404 in the region N1 is the tantalum carbide film 601 having a work function of 4.2 eV and the metal material in contact with the gate insulating film 404 in the region P1 is the tungsten film 405 having a work function of 4.9 eV, an NMIS transistor and a PMIS transistor are formed in the region N1 and the region P1, respectively.

In this way, it is possible to fabricate a semiconductor device which exhibits a lowered interface resistance at the polysilicon/metal interface in the polysilicon/metal stacked electrode structure thereby preventing the operation speed thereof from lowering.

Comparative Example

Description will be made of a method of fabricating a semiconductor device according to a comparative example with reference to the drawings. Since the steps illustrated in FIGS. 4 to 6 are each the same as in the foregoing embodiment, description thereof will be omitted.

Figure 18:
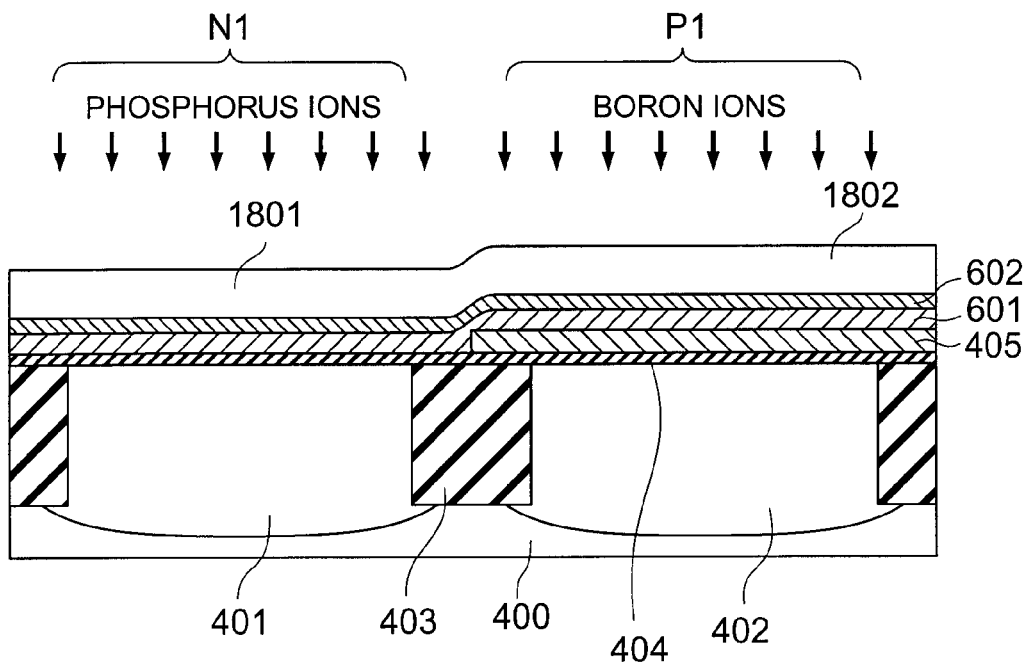
FIG. 18 is a sectional view illustrating one step of a method for manufacturing a semiconductor device according to a comparative example.

As shown in FIG. 18, a polysilicon film is formed over the titanium nitride film 602, and the region N1 is subjected to phosphorus ion implantation to form an n-type polysilicon film 1801. The region P1 is subjected to boron ion implantation to form a p-type polysilicon film 1802.

Since the succeeding steps are the same as those illustrated in FIGS. 8 to 17, description thereof will be omitted.

Figure 19:
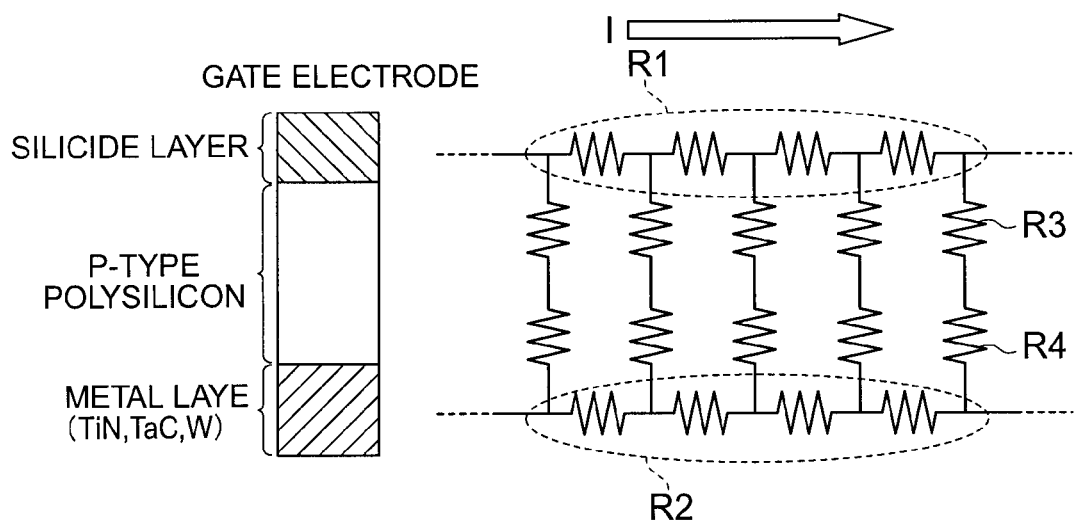
FIG. 19 is an equivalent circuit diagram of a gate electrode of a semiconductor device according to a comparative example.

FIG. 19 shows an electrical equivalent circuit in which the PMIS transistor gate electrode of the semiconductor device thus fabricated is regarded as an interconnection line. The horizontal direction coincides with a longitudinal direction of the gate electrode. The equivalent circuit includes a resistance R1 of the silicide layer (i.e., nickel silicide film), a resistance R2 of the metal layer (including the titanium nitride film, tantalum carbide film, and tungsten film), a contact resistance R3 between the silicide layer and the p-type polysilicon film, and a contact resistance R4 between the p-type polysilicon film and the metal layer. Current I is a current passing through the transistor.

The resistance R1 is less than 10Ω, the resistance R2 less than 200Ω, and the resistance R3 less than 10Ω.

Figure 20:
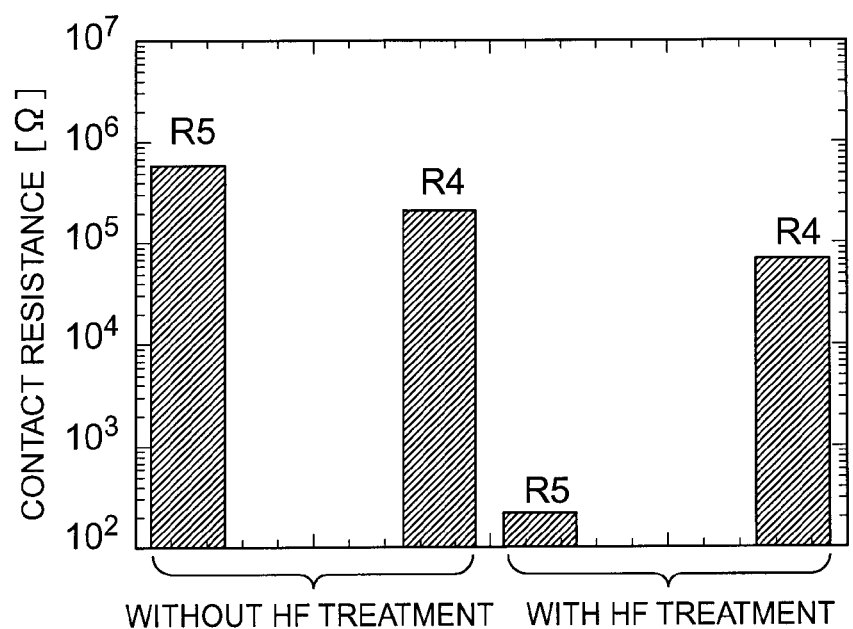
FIG. 20 is a graph showing contact resistances obtained before and after a diluted HF treatment.

FIG. 20 shows values of resistance R4 obtained with or without the diluted HF treatment. For comparison, values of contact resistance R5 between the n-type polysilicon film and the metal layer are also shown.

Without the diluted HF treatment, the contact resistance R5 is higher than the contact resistance R4. This is because a natural oxide formed on the n-type polysilicon film is thicker than that formed on the p-type polysilicon film. Therefore, the contact resistance R5 lowers considerably when the natural oxides are removed by the diluted HF treatment.

By contrast, the contact resistance R4 lowers little even when the diluted HF treatment is carried out. This is because boron in the p-type polysilicon film is bonded to nitrogen in the titanium nitride film of the metal layer to form a B—N reaction layer, so that an electrically active boron concentration in the vicinity of the polysilicon film interface decreases.

The decrease in the boron concentration results in a behavior like the so-called Schottky junction between metal and semiconductor, thus making it difficult for a current to pass across the metal-semiconductor interface. As a result, the contact resistance rises.

Thus, the contact resistance R4 is far higher than any other resistance component in the equivalent circuit of FIG. 19. When passing longitudinally of the gate electrode, the current I is allowed to pass through the low-resistant silicide layer easily. However, the current I passes vertically of the gate electrode with difficulty because the contact resistance between the polysilicon film and the metal layer is high. For this reason, the operation speed of the transistor lowers.

Such a phenomenon is related to the presence of boron in the polysilicon film and the presence of nitrogen in the metal film. Therefore, even when an n-type polysilicon film is used in the PMIS transistor instead of the p-type polysilicon film, limitations on the circuit design become serious because of a rise in contact resistance due to the B—N bond and a decrease in the operation speed of the transistor which occur when not less than a predetermined concentration of boron used as an impurity in forming the diffusion layers for example is allowed to intrude into the n-type polysilicon film.

By contrast, the semiconductor device according to the above-described embodiment is capable of limiting the interface resistance (i.e., the contact resistance between the polysilicon film and the metal layer) to a low value thereby preventing the operation speed thereof from lowering, by using n-type polysilicon films for both of the polysilicon films used in the gate electrodes of the NMIS transistor and PMIS transistor while setting the boron concentration in the polysilicon film of the PMIS transistor to a value of not more than about $1 \times 10^{19}$ cm$^{-3}$.

The foregoing embodiment is only illustrative and should not be construed to limit the present invention. For example, the titanium nitride film forming the reaction preventive film in contact with the polysilicon film according to the foregoing embodiment may be a film of a nitride of a metal belonging to IVa group (including Ti, Zr, and Hf), Va group (including V, Ng, and Ta), or VIa group (including Cr, Mo, and W) of the periodic table, for example, a tantalum nitride film, tungsten nitride film, or titanium silicon nitride (TiSiN) film.

In cases where a metal carbide is used for the reaction preventive film, it is necessary to prevent the interface resistance from rising due to a B—C bond formed between boron in the polysilicon film and carbon in the metal carbide. Even in such cases, application of a semiconductor device like the foregoing embodiment makes it possible to prevent the interface resistance from rising, thereby to prevent the operation speed of the transistor from lowering. Such a metal carbide is a carbide of a metal belonging to the aforementioned IVa, Va and VIa groups, for example, a titanium carbide film or a tungsten carbide film.

Alternatively, the reaction preventive film may be formed from silicon nitride or silicon oxide.

While the foregoing embodiment uses tantalum carbide as the gate electrode material that determines the work function of the NMIS transistor, and tungsten as the gate electrode material that determines the work function of the PMIS transistor, any combination of a metal having a work function of not more than 4.3 eV and a metal having a work function of not less than 4.8 eV can serve the purpose.

While the semiconductor device according to the foregoing embodiment has the metal gate transistors which differ in work function from each other according to the types of regions, namely, the nMIS region and pMIS region, i.e., the so-called "dual metal transistors", it is possible to form single metal transistors using the same material.

While the foregoing embodiment uses a hafnium-based oxide film as the gate insulating film material, it is possible to use, for example, an oxide of Zr, Ti, Ta, Al, Sr, Y, La, or the like, or an oxide of a combination of silicon and any one of these elements, such as ZrSixOy, instead of such a hafnium-based oxide. Alternatively, stacked films of such oxides may be used.

According to the foregoing embodiment, the tungsten film 405 is formed over the gate insulating film 404 and, after removal of the portion of the tungsten film 405 which lies in the region N1, the tantalum carbide film 601 is formed over the entire surface, as shown in FIGS. 4 to 6. However, it is possible that a tantalum carbide film is formed over the gate insulating film 404 and, after removal of a portion of the tantalum carbide film which lies in the region P1, a tungsten film is formed over the entire surface.

Such a process forms an NMIS transistor having a gate electrode in which a tantalum carbide film, tungsten film, titanium nitride film, polysilicon film and nickel silicide film are sequentially stacked, and an PMIS transistor having a gate electrode in which a tungsten film, titanium nitride film, polysilicon film and nickel silicide film are sequentially stacked.

What is claimed is:

1. A semiconductor device comprising:
    an n-channel MISFET comprising first diffusion layers formed in a first region of a surface portion of a semiconductor substrate so as to sandwich a first channel region therebetween, a first gate insulating film formed on the first channel region, and a first gate electrode including a first metal film formed on the first gate insulating film, a first metal carbide film formed above the first metal film, and a first n-type polysilicon film formed on the first metal carbide film; and
    a p-channel MISFET comprising second diffusion layers containing boron as a dopant and formed in a second region of the surface portion of the semiconductor substrate so as to sandwich a second channel region therebetween, a second gate insulating film formed on the second channel region, and a second gate electrode including a second metal film formed on the second gate insulating film, a second metal carbide film formed above the second metal film, and a second n-type polysilicon film which is formed on the second metal carbide film and has a boron concentration of not more than $5 \times 10^{19}$ cm$^{-3}$ in a portion adjacent to an interface with the second metal carbide film; and
    the semiconductor device further comprising a third metal film between the second metal film and the second metal carbide film, wherein the first metal film and the third metal film contain the same metallic element.

2. The semiconductor device according to claim 1, wherein the second n-type polysilicon film has a boron concentration of not more than $1 \times 10^{19}$ cm$^{-3}$ in the portion adjacent the interface with the second metal layer carbide film.

3. The semiconductor device according to claim 1, wherein the first metal film has a work function of not more than 4.3 eV, while the second metal film has a work function of not less than 4.8 eV.

4. The semiconductor device according to claim 1, wherein the first and second gate insulating films each contain any one of oxides of Hf, Zr, Ti, Ta, Al, Sr, Y, and La.

5. A semiconductor device comprising:
    an n-channel MISFET comprising first diffusion layers formed in a first region of a surface portion of a semiconductor substrate so as to sandwich a first channel region therebetween, a first gate insulating film formed on the first channel region, and a first gate electrode including a first metal film formed on the first gate insulating film, a first metal carbide film formed above the first metal film, and a first n-type polysilicon film formed on the first metal carbide film; and
    a p-channel MISFET comprising second diffusion layers containing boron as a dopant and formed in a second region of the surface portion of the semiconductor substrate so as to sandwich a second channel region therebetween, a second gate insulating film formed on the second channel region, and a second gate electrode including a second metal film formed on the second gate insulating film, a second metal carbide film formed above the second metal film, and a second n-type polysilicon film which is formed on the second metal carbide film and has a boron concentration of not more than $5 \times 10^{19}$ cm$^{-3}$ in a portion adjacent to an interface with the second metal carbide film; and
    the semiconductor device further comprising a third metal film between the first metal film and the first metal carbide film, wherein the second metal film and the third metal film contain the same metallic element.

* * * * *